(12) United States Patent
Anderson et al.

(10) Patent No.: US 6,867,460 B1
(45) Date of Patent: Mar. 15, 2005

(54) FINFET SRAM CELL WITH CHEVRON FINFET LOGIC

(75) Inventors: Brent A. Anderson, Jericho, VT (US); Andres Bryant, Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,907

(22) Filed: Nov. 5, 2003

(51) Int. Cl.[7] .................. H01L 27/01; H01L 21/336
(52) U.S. Cl. .................. 257/351; 257/903; 257/628; 257/393; 438/198; 438/150
(58) Field of Search ............... 257/351, 903, 257/627, 628, 369, 393; 438/198, 199, 150, 154, 275

(56) References Cited

U.S. PATENT DOCUMENTS

| | | | |
|---|---|---|---|
| 5,970,330 A | 10/1999 | Buynoski | |
| 6,117,722 A | 9/2000 | Wuu et al. | |
| 6,150,693 A | 11/2000 | Wollesen | |
| 6,413,802 B1 | 7/2002 | Hu et al. | |
| 6,475,869 B1 | 11/2002 | Yu | |
| 6,525,403 B2 | 2/2003 | Inaba et al. | |
| 6,657,259 B2 | * 12/2003 | Fried et al. | .................. 257/350 |
| 6,765,303 B1 | * 7/2004 | Krivokapic et al. | .......... 257/25 |

* cited by examiner

Primary Examiner—Mark V. Prenty
(74) Attorney, Agent, or Firm—Schmeiser, Olsen & Watts; William D. Sabo

(57) ABSTRACT

An electronic device, and SRAM and a method of forming the electronic device and SRAM. The semiconductor device including: a pass gate transistor having a fin body having opposing sidewalls aligned in a first direction and having a first majority carrier mobility and a gate adjacent to both sidewalls of the fin body; a pull down latch transistor having a fin body having opposing sidewalls aligned in a second direction and having a second majority carrier mobility and a gate adjacent to both sidewalls of the fin body; a pull up latch transistor having a fin body having opposing sidewalls aligned in a third direction and having a third majority carrier mobility and a gate adjacent to both sidewalls of the fin body; and CMOS chevron logic circuits, wherein crystal planes of each fin body and of CMOS transistor of the chevron logic are co-aligned.

30 Claims, 10 Drawing Sheets

US 6,867,460 B1

FINFET SRAM CELL WITH CHEVRON FINFET LOGIC

BACKGROUND OF INVENTION

1. Field of the Invention

The present invention relates to the field of semiconductor devices; more specifically, it relates to a static random access memory (SRAM) cell using fin field effect transistor (FinFET) technology.

2. Background of the Invention

The need for increased device density in CMOS integrated circuits has led to the use of FINFET CMOS logic circuits. In a FinFET vertical "fins" of crystalline silicon are used to form the body of each transistor and gates are formed on each side of the body. When gates are formed on both sides of the body, the transistor is generally referred to as a double gate FinFET. An advantage of FinFET transistors is that the "fin" can be formed so that the channel region of each transistor is aligned relative to the crystal planes of the silicon allowing control of the majority carrier mobility of both PFETs and NFETs independently which is not possible in standard (planar) CMOS technology. However, much of the density advantage of FinFET technology, which uses various crystal planes could be lost when applied to SRAM designs. Thus, there is a need for a FinFET SRAM design that fully utilizes the advantages of FinFET technology.

SUMMARY OF INVENTION

A first aspect of the present invention is an electronic device comprising: a semiconductor device comprising: a pass gate transistor including a first fin body and a first gate, the first fin body having opposing sidewalls, each sidewall aligned in a first direction having a first majority carrier mobility, the first gate adjacent to both sidewalls of the first fin body; a pull down latch transistor including a second fin body and a second gate, the second fin body having opposing sidewalls, each sidewall aligned in a second direction having a second majority carrier mobility, the second gate adjacent to both sidewalls of the second fin body; a pull up latch transistor including a third fin body and a third gate, the third fin body having opposing sidewalls, each sidewall aligned in a third direction having a third majority carrier mobility, the third gate adjacent to both sidewalls of the third fin body; wherein all of the first, second and third directions are not the same direction; and one or more CMOS chevron logic circuits, crystal planes of bodies of transistors of the CMOS chevron logic circuits and crystal planes or the first, second and third fin bodies co-aligned.

A second aspect of the present invention is a method of fabricating a semiconductor device comprising: forming a first fin body of a pass gate transistor from a crystal layer, the first fin body having opposing sidewalls, each sidewall aligned in a first direction having a first majority carrier mobility; forming a second fin body of a pull down latch transistor from the crystal layer, the second fin body having opposing sidewalls, each sidewall aligned in a second direction having a second majority carrier mobility; forming a third fin body or a pull up latch transistor from the crystal layer the third fin body having opposing sidewalls, each sidewall aligned in a first direction having a third majority carrier mobility; and forming a first gate adjacent to both sidewalls of the first fin body, a second gate adjacent to both sidewalls of the second fin body and a third gate adjacent to both sidewalls of the third fin body wherein all of the first, second and third directions are not the same direction; and forming bodies of CMOS devices of one or more CMOS chevron logic circuits from the crystal layer.

A third aspect of the present invention is an electronic device comprising: an SRAM cell comprising: first and second pass gate transistors, each pass gate transistor including a fin body and a gate, the first fin bodies each having opposing sidewalls and each sidewall aligned in a first direction having a first majority carrier mobility, the gate adjacent to both sidewalls; first and second pull down latch transistors, each pull down transistor including a fin body and a gate, each fin body having opposing sidewalls and each sidewall aligned in a second direction having a second majority carrier mobility, the gale adjacent to both sidewalls; first and second pull up latch transistors, each latch transistor including a fin body and a gate, each fin body having opposing sidewalls and each sidewall aligned in a third direction having a third majority carrier mobility, the gate adjacent to both sidewalls, the third direction aligned between a {100} crystal piano and a {110} crystal plane of the fin bodies of the first and second pull up latch transistors; and wherein all of the first, second and third directions are not the same direction; and one or more CMOS chevron logic circuits, crystal planes of bodies of transistors of the CMOS chevron logic circuits aligned with crystal planes of the fin bodies of the pass gate transistors, the pull down latch transistors and the pull up latch transistors.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

In crystalline solids, the atoms, which make up the solid, are spatially arranged in a periodic fashion called a lattice.

A crystal lattice always contains a volume, which is representative of the entire lattice and is regularly repeated throughout the crystal. In describing crystalline semiconductor materials in the present disclosure, the following conventions will be used.

The directions in a lattice are expressed as a set of three integers with the same relationship as the components of a vector in that direction. For example, in cubic lattices, such as silicon, that has a diamond crystal lattice, a body diagonal exists along the [111] direction with the [ ] brackets denoting a specific direction. Many directions in a crystal lattice are equivalent by a symmetry transformation, depending upon the arbitrary choice of orientation axes. For example, a crystal directions in the cubic lattice [100], [010] and [001] are all crystallographically equivalent. A direction and all its equivalent directions are denoted by < > brackets. Thus, the designation of the <100> direction includes the equivalent [100], [010] and [001] positive directions as well as the equivalent negative directions [−100], [0−10] and [00−1].

Planes in a crystal may also be identified with a set of three integers. They are used to define a set of parallel planes and each set of integers enclosed in ( ) parentheses identifies a specific plane. For example the proper designation for a plane perpendicular to the [100] direction is (100). Thus, if either a direction or a plane of a cubic lattice is known, its perpendicular counterpart may be quickly determined without calculation. Many planes in a crystal lattice are equivalent by a symmetry transformation, depending upon the arbitrary choice of orientation axes. For example, the (100), (010) and (001) planes are all crystallographically equivalent. A plane and all its equivalent planes are denoted by { } parentheses. Thus, the designation of the {100} plane includes the equivalent (100), (010) and (001) positive planes as well as the equivalent planes (−100), (0−10) and (00−1).

FIGS. 1A, 2A, 3A and 4A are views top views illustrating fabrication of FinFET devices according to the present invention. FIGS. 1B, 2B, 3B and 4B are partial cross-sections illustrating fabrication of FinFET devices through lines 1B—1B, 2B—2B, 3B—3B and 4B—4B of FIGS. 1A, 2A, 3A and 4A respectively.

Figure 1A:
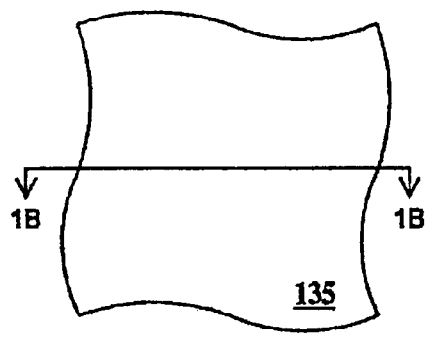
FIGS. 1A, 2A, 3A and 4A are top views illustrating fabrication of FinFET devices according to the present invention.
Figure 1B:
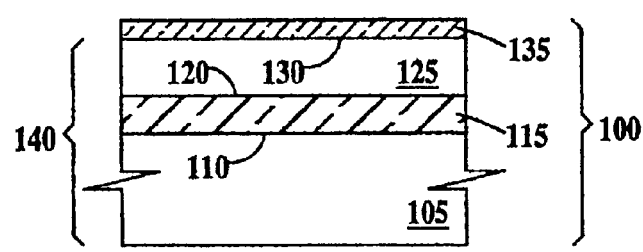
FIGS. 1B, 2B, 3B and 4B are partial cross-sections views illustrating fabrication of FinFET devices through lines 1B—1B, 2B—2B, 3B—3B and 4B—4B of FIGS. 1A, 2A, 3A and 4A respectively.
Figure 6:
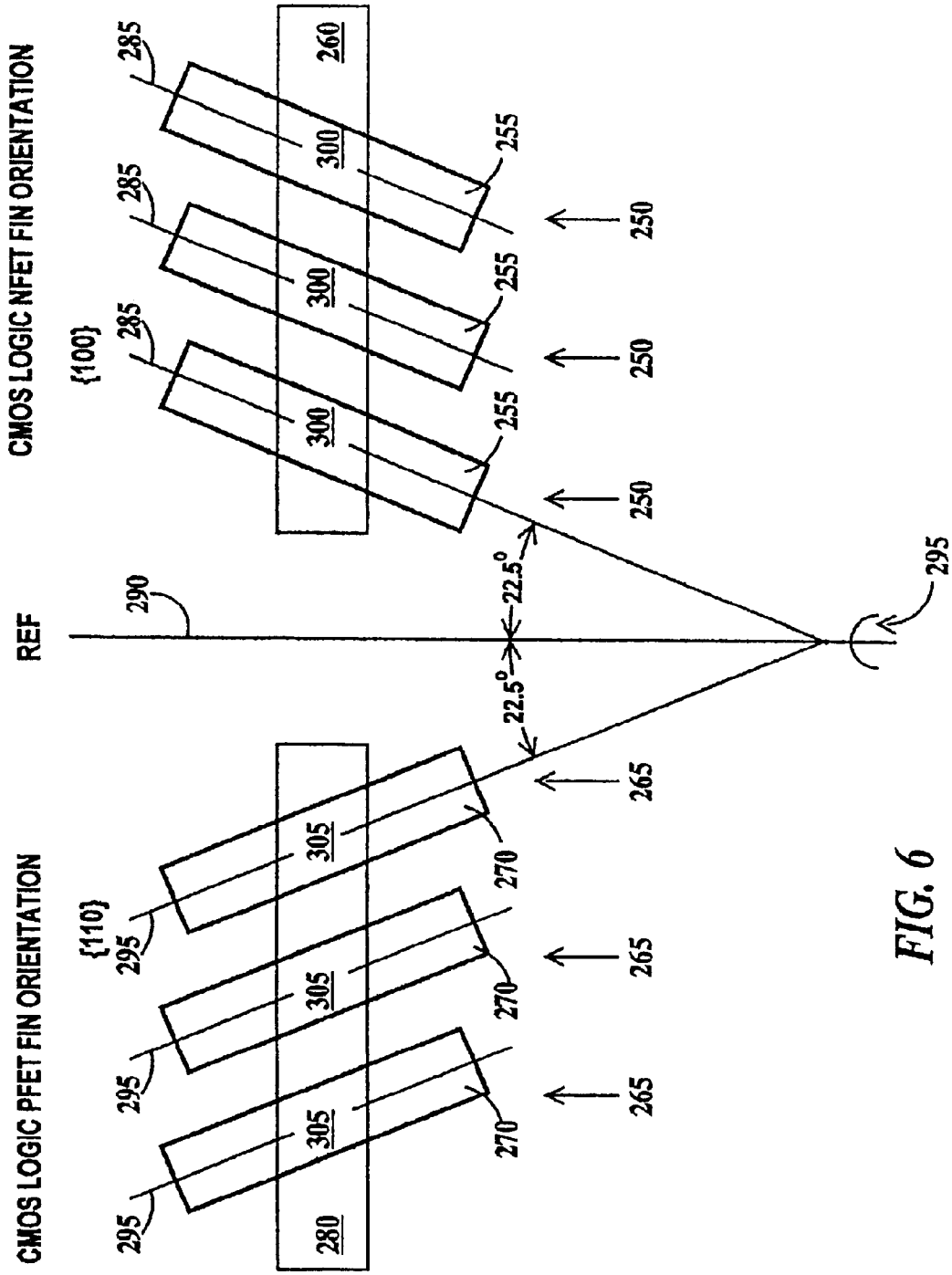
FIG. 6 is a top view of a portion of a substrate having fully optimized (for mobility of the majority carriers) NFET and PFET devices.

Referring to FIGS. 1A and 1B, a substrate 100 includes a substrate 105 having a top surface 110, a buried insulator layer 115 having a top surface 120, the buried insulator layer formed on top surface 115 of substrate 105, a crystalline semiconductor layer 125 having a top surface 130, the crystalline semiconductor layer formed on the top surface of the buried insulator layer and a masking layer 135 formed on the top surface of the crystalline silicon layer. Substrate 105 may be composed of any appropriate semiconductor material, including, but not limited to: Si, Ge, GaP, InAs, InP, SiGe, GaAs, or other group II/V compounds. In one example, substrate 105 may comprise single crystal silicon, top surface 110 orientated on a {110} crystal plane. Crystal plane orientations are illustrated in FIG. 6 and described infra.

Buried insulator layer 115 may be formed on substrate 105 using any well known thermal oxidation process, such as rapid thermal oxidation (RTO) or furnace oxidation. Buried insulator 115 may comprise a layer of silicon between two layers of silicon dioxide ($SiO_2$), a combination known as buried oxide (BOX) or a single layer of insulator such as a single layer of $SiO_2$.

Crystalline semiconductor layer 125 may be composed of any appropriate semiconductor material, including, but not limited to: Si, Ge, GaP, InAs, InP, SiGe, GaAs, or other group II/V compounds. In one example, crystalline semiconductor layer 125 may comprise single crystal silicon, top surface 110 orientated on a {110} crystal plane and substrate 105, buried insulator layer 115 and crystalline semiconductor layer 125 comprise a single silicon-on-insulator substrate (SOI) 140. As described infra, the thickness of crystalline semiconductor layer 125 will define the height of the fins of FinFETs devices. In one example, crystalline semiconductor layer 125 may be 20 to 160 nm thick.

Figure 2A:
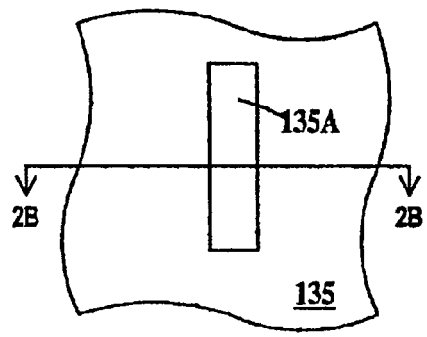
Figure 2B:
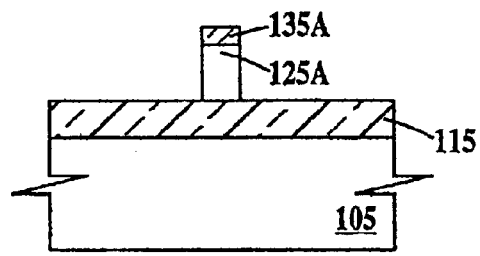

Masking layer 135 is used as an etch stop layer when defining the fins of the FinFET devices as illustrated in FIGS. 2A and 2B and described infra. In one example, masking layer 135 is $SiO_2$ or silicon nitride ($Si_3N_4$).

Referring to FIGS. 2A and 2B, hard mask 135A is formed from masking layer 135 (see FIG. 1B) by any well known photolithographic process followed by any well known reactive ion etch (RIE) process selective to insulating layer 135 over crystalline semiconductor layer 125 (see FIG. 1A). The photoresist used in the photolithographic process is then removed and fin 125A formed by etching crystalline semiconductor layer 125 (see FIG. 1A) by any well known reactive ion etch (RIE) process selective to: crystalline semiconductor layer 125 (see FIG. 1A) over hard mask 135A. The orientation of hard mask 135A relative to the crystal planes of crystalline semiconductor layer 125 (see FIG. 1A) will determine the mobility of the majority carriers in fin 125A. This is more fully discussed infra in relation to FIG. 3.

Fin 125A may be optionally doped to form P-well or N-well in the completed NFET or PFET. Examples of dopants for P-wells include B, In and Ga. Examples of dopants for N-wells include P, AS and Sb. Dopants may be introduced, for example, by ion implantation at concentrations of about 1E17 $atm/cm^3$ to about 5E18 $atm/cm^3$.

Figure 3A:
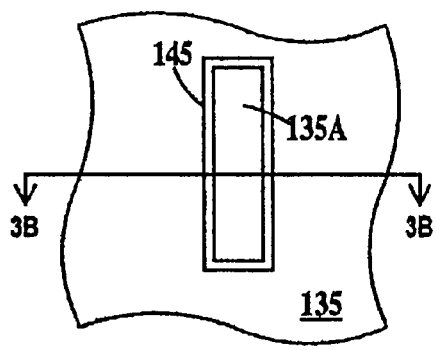
Figure 3B:
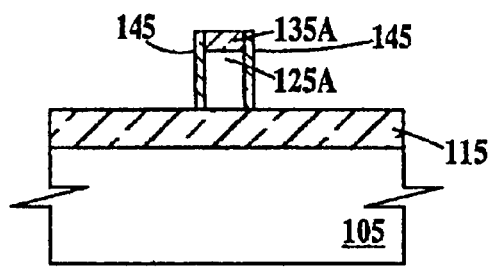

Referring to FIGS. 3A and 3B, a gate insulator 145 is formed over all exposed sidewalls of fin 125A. In one example, gate insulator is formed by thermal oxidation in a furnace or by deposition of a dielectric film. Examples of gate insulator materials include SiO2, nitrided oxides such as $SiO_xN_y$, high K dielectric materials such as $Al_2O_3$ or $HfO_2$, or combinations thereof.

Figure 4A:
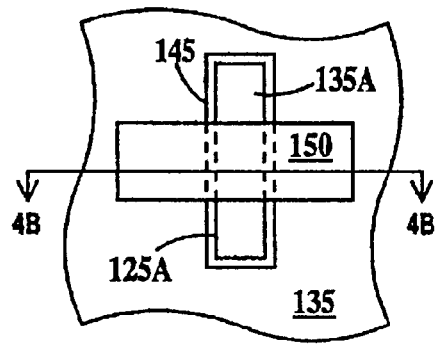
Figure 4B:
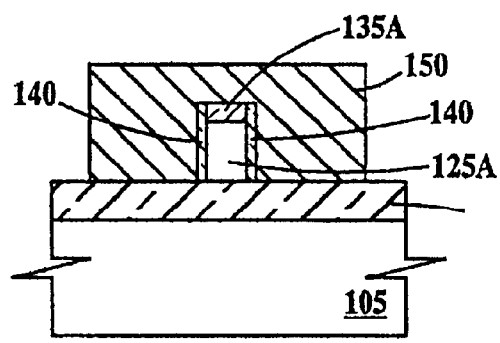

Referring to FIGS. 4A and 4B, a gate conductor 150 is formed over fin 150 by deposition of a suitable gate material followed by a photolithographic process or a photolithographic/hard mask process followed by a RIE process and a photoresist (and hard mask) removal process as is well known in the art. Examples of suitable gate materials include doped and undoped polysilicon, doped and undoped amorphous silicon, polysilicon-germanium, W, Mo, Ta or other refractory metals and combinations thereof. In the case of silicon containing gate materials, an underlying silicide layer of Ni or Co in contact with fin 125A may be included.

Portions of fins 125A not covered by gate 150 may be doped N or P type in order to form source/drain (S/D) regions. In a first example, S/D regions for a PFET are formed by ion implantation of B, In or Ga using a dose of about 5E14 atm/cm to about 2E15 atm/cm at energies of about 0.5 to 3 Kev. In a second example, S/D regions for an NFET are formed by ion implantation of P, AS or Sb using a dose of about 5E14 $atm/cm^2$ to about 2E15 $atm/cm^2$ at energies of about 1 to 5 Kev. Optionally, extension and halo implants, angled to normal to the top surface of the substrate may be performed. In a first example, extension and halo implants for an NFET are performed using B, In or Ga using a dose of about 1E13 $atm/cm^2$ to about 8E13 atm/cm at energies of about 5 to 15 Kev. In a second example, extension and halo implants for a PFET are performed using P, AS or Sb using a dose of about 1E13 atm/cm$^2$ to about 8E13 atm/cm$^2$ at energies of about 20 to 45 Kev.

FinFETs are completed by depositing an interlevel dielectric (ILD) over the entire substrate, chemical-mechanical-polishing (CMP) the ILD flat, forming contact holes through the ILD to the gate and source drains using, for example, an RIE process and filling the contact holes with a conductive material such as doped polysilicon, metal silicides such as WSi, metals such as Au, Al, Mo, Ta, Ti, Cu or ITO (indium-tin oxide) or combinations thereof by deposition, evaporation or sputtering. A second CMP process may be performed to planarize the contact material even with the ILD. The FinFET of FIGS. 4A and 4B is a double gated FinFET.

Figure 5:
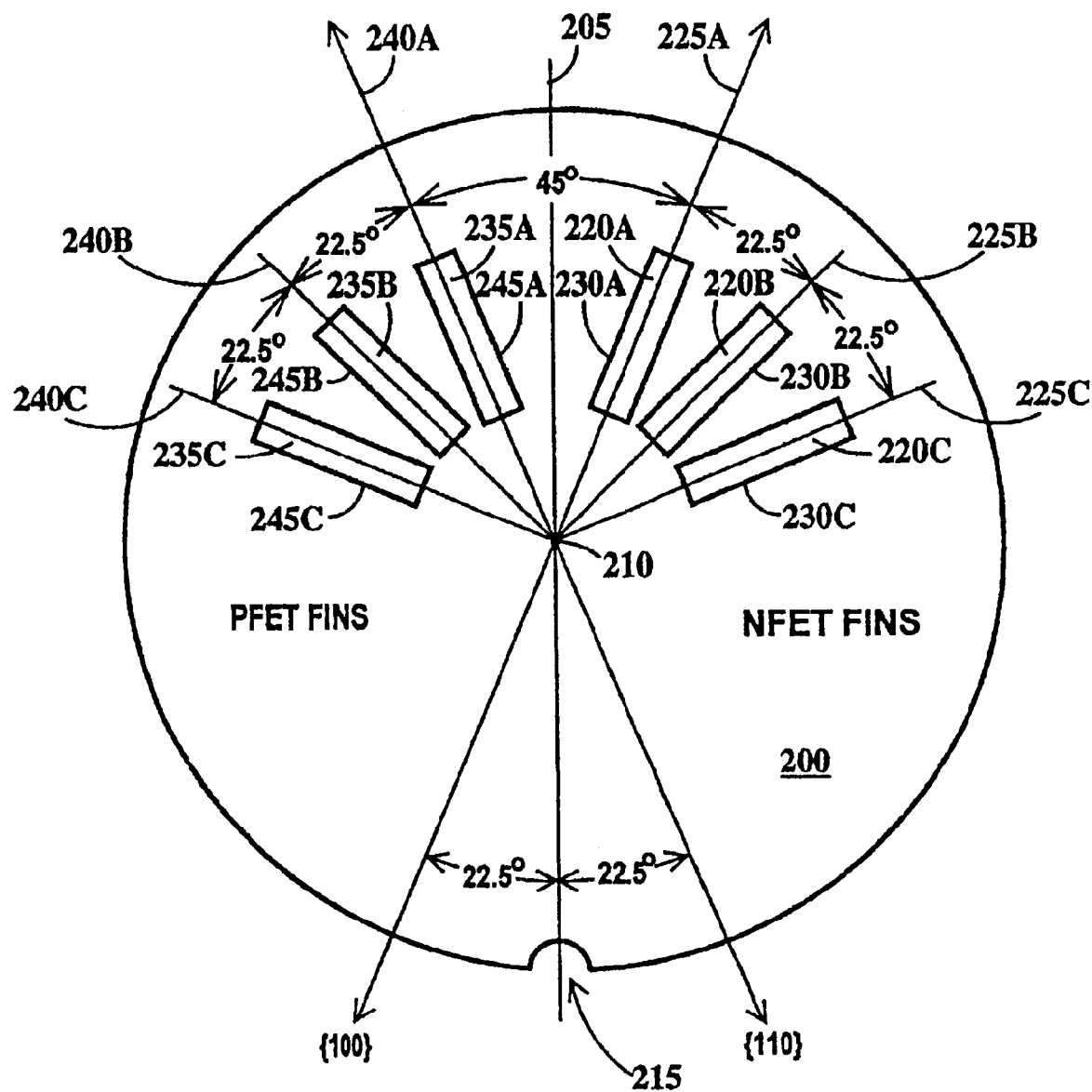
FIG. 5 is a schematic diagram of a substrate illustrating the various orientations of the fins of PFET and NFET devices relative to the crystal planes of the crystalline silicon.

FIG. 5 is a schematic diagram of a substrate illustrating the various orientations of the fins of PFET and NFET devices relative to the crystal planes of crystalline silicon. Crystalline silicon will be used as an exemplary semiconductor substrate in describing the present invention henceforth. However, the invention is applicable to other crystalline semiconductor substrates as discussed supra.

The mobility of the holes in the channel of NFETs is nearly its highest in the {100} plane and significantly lower in the {110} plane. The electron mobility in the {110} plane is about half that in the {100} plane. The mobility holes in the channel of PFETs is highest in the {110} plane and significantly lowest in the {100} plane. The hole mobility in the {100} plane is about less than half that in the {110} plane. The {100} and {110} planes are orientated to each other at an angle of 45° when formed by vertical surfaces cut from a {100}-surfaced wafer. Thus, the orientation of major sidewalls (or channel which is perpendicular to the major sidewalls) of the fins of a FinFET relative to the crystal planes of a semiconductor substrate can be used to alter the drive strength (amount of current) of an FET.

In FIG. 5, the {100} plane of a silicon substrate is seen to be rotated 45° from the {110} plane. Both the {100} and {110} planes are rotated 22.5° from a centerline 205 running through the center 210 and notch 215 of substrate 200. The {100} plane is rotated clockwise from centerline 205 and the {110} is rotated counterclockwise from the centerline. FIGS. 6, 8, 9, 10, 11 and 12 as well as FIG. 5 of the present disclosure are based on a <100> substrate having a notch located +22.5° (or −22.5°) from the {100} plane and −22.5° (or +22.5°) from the {110} plane.

In FIG. 5, three exemplary NFET fins 220A, 220B and 220C are formed on substrate 200. A major axis 225A of fin 220A is aligned along the {100} plane. Sidewalls 230A of fin 220A are also aligned along the {100} plane and hence an NFET fabricated from fin 220A (or any fin orientated with a major axis in the {100} plane) will have high electron mobility and high drive. High majority carrier mobility in an NFET is defined by this fin orientation (fin 220A orientation) herein and in the claims. A major axis 225C of fin 220C is rotated 45° from major axis 225A of fin 225A. Thus, major axis 225C of fin 220C is aligned along the {110} plane. Sidewalls 230C of fin 220C are also aligned along the {110} plane and hence an NFET fabricated from fin 220C (or any fin orientated with a major axis in the {110} plane) will have low electron mobility and low drive. Low majority carrier mobility in an NFET is defined by this fin orientation (fin 220C orientation) herein and in the claims. A major axis 225B of fin 220B is rotated 22.5° from major axis 225A of fin 225A. Thus, major axis 225B of fin 220B is aligned along neither the {100} nor {110} plane. Sidewalls 225B of fin 220B are also aligned along neither the {100} nor {110} plane and hence an NFET fabricated from fin 220B (or any fin orientated with a major axis parallel to axis 225B) will have a medium electron mobility and a medium amount of drive. Medium majority carrier mobility in an NFET is defined by this fin orientation (fin 220B orientation) herein and in the claims.

Also in FIG. 5, three exemplary PFET fins 235A, 235B and 235C are formed on substrate 200. A major axis 240A of fin 235A is aligned along the {110} plane. Sidewalls 245A of fin 235A are also aligned along the {110} plane and hence a PFET fabricated from fin 235A (or any fin orientated with a major axis in the {110} plane) will have a relatively high mobility and high drive. High majority carrier mobility in a PFET is defined by this fin orientation (fin 235A orientation) herein and in the claims. A major axis 240C of fin 235C is rotated 45° from major axis 240A of fin 235A. Thus, major axis 240C of fin 235C is aligned along the {100} plane. Sidewalls 245C of fin 235C are; also aligned along the {100} plane and hence a PFET fabricated from fin 235C (or any fin orientated with a major axis in the {100} plane) will have low hole mobility and low drive. Low majority carrier mobility in a PFET is defined by this fin orientation (fin 235C orientation) herein and in the claims. A major axis 240B of fin 235B is rotated 22.5° from major axis 240A of fin 235A. Thus, major axis 240B of fin 235B is aligned along neither the {100} nor {110} plane. Sidewalls 245C of fin 235C are also aligned along neither the {100} nor {110} plane and hence a PFET fabricated from fin 235B (or any fin orientated with a major axis parallel to axis 240B) will have a medium hole mobility and medium amount of drive. Medium majority carrier mobility in a PFET is defined by this fin orientation (fin 235B orientation) herein and in the claims.

FIG. 6 is a top view of a portion of a substrate having optimized (for mobility of the majority carriers) NFET and PFET devices. In FIG. 6, NFETs 250 includes fins 255 and a common gate 260 and PFETs 265 includes fins 270 and a common gate 280. Only fins 255 and 270 and gates 260 and 280 of corresponding NFETs 250 and PFETs 265 are illustrated for clarity. Additional structures such as gate dielectrics and contacts are not illustrated, but are present as described supra.

The major axes 285 of each fin 255 are orientated at an angle of 22.5° from a reference line 290, which bisects a notch 295. Major axes 285 are aligned along a {100} crystal plane. Thus, channel regions 300 (defined by the overlap of gate 260 with fins 255) of NFETs 250 are orientated along a {100} crystal plane and NFETs 250 have a high majority carrier mobility and high drive.

The major axes 295 of each fin 270 are orientated at an angle of −22.5° from reference line 290. Major axes 295 are aligned along a {110} crystal plane. Thus, the channel regions 305 (defined by the overlap of gate 280 with fins 270) of each PFET 265 are orientated along a {110} plane and PFETs 255 have a relatively high majority carrier mobility and relatively high drive. Fins 255 of NFETs 250 and fins 270 of PFETs 265 form a chevron and CMOS circuits using NFETs and PFETs similar to NFETs 250 and PFETs 265 defines a technology called chevron CMOS logic or just chevron logic.

The three NFETs 250 and three PFETs 265 illustrated in FIG. 6 are exemplary and any number and configuration of devices may be interconnected to form chevron CMOS logic circuits. Only the fin axes orientations relative to crystal planes must be maintained.

Figure 7:
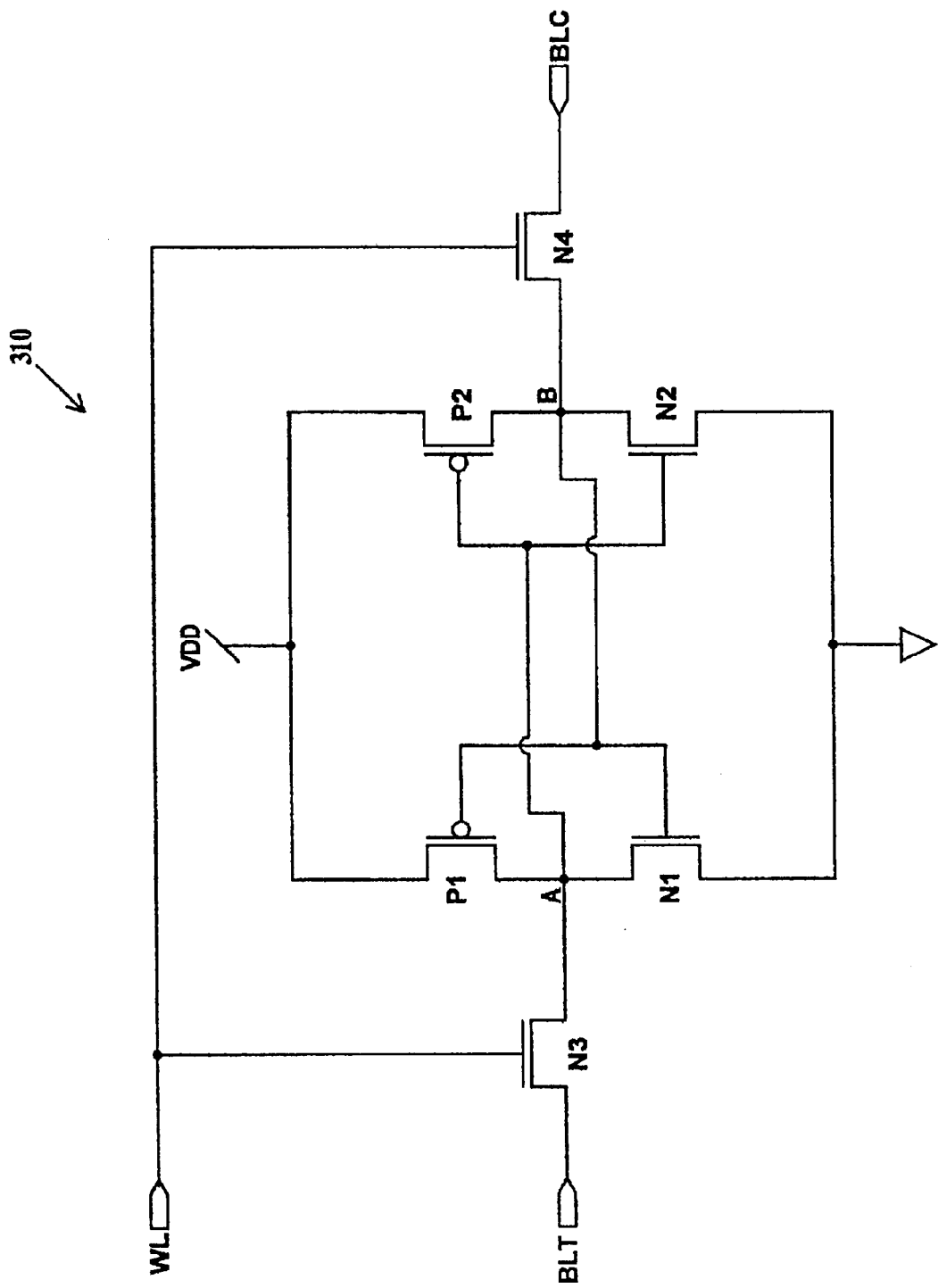
FIG. 7 is a schematic diagram of a SRAM cell according to the present invention.

FIG. 7 is a schematic diagram of an SRAM cell 310 according to the present invention. In FIG. 7, SRAM cell 310 includes two latch pull-up PFETs P1 and P2, two pull-down NFETs N1 and N2 and two pass gate NFETs N3 and N4. PFETs P1 and P2 and NFETs N1 and N2 comprise a cross-coupled latch. A first S/D of NFET N3 is coupled to a bitline true node BLT and a second S/D of NFET N3 is coupled to a node A. A first S/D of NFET N4 is coupled to a bitline complement node BLC and a second S/D of NFET N4 is coupled to a node B. The gates of NFETs N3 and N4 are coupled to a word line node WL. The drains of PFET P1 and NFET N1 and the gates of PFET P2 and NFET N2 are coupled to node A. The drains of PFET P2 and NFET N2 and the gates of PFET P1 and NFET Ni are coupled to node B. The sources of PFETs P1 and P2 are coupled to VDD (power) and the sources of NFETs N1 and N2 are coupled to ground.

In operation, a high on BLT will turn off PFET P2 and turn on NFET N2 storing a low at node B, which will turn on PFET P1 and turn off NFET N1 reinforcing the high at node A. A low on BLT will turn on PFET P2 and turn off NFET N2 storing a high at node B, which will turn off PFET P1 and turn on NFET N1 reinforcing the low at node A. A high on BLC will turn off PFET P1 and turn on NFET N1 storing a low at node A, which will turn on PFET P2 and turn off NFET N2 reinforcing the high at node A. A low on BLC will turn on PFET P1 and turn off NFET N1 storing a high at node A, which will turn off NFET P2 and turn on NFET N2 reinforcing the low at node B.

When designing SRAM cells, the performance of an SRAM cell can be increased by increasing the drive of the pull-down NFETs N1 and N2 and/or pass gate NFETs N3 and N4. When the devices are fabricated using FinFETs, the increase in drive required can be accomplished by increasing the mobility of the majority carriers of the NFETs. However, the use of FinFETs in this manner can decrease the density of SRAM cells. The tradeoff between SRAM density and performance is discussed infra in references to FIGS. 9, 10, 11 and 12.

Figure 8:
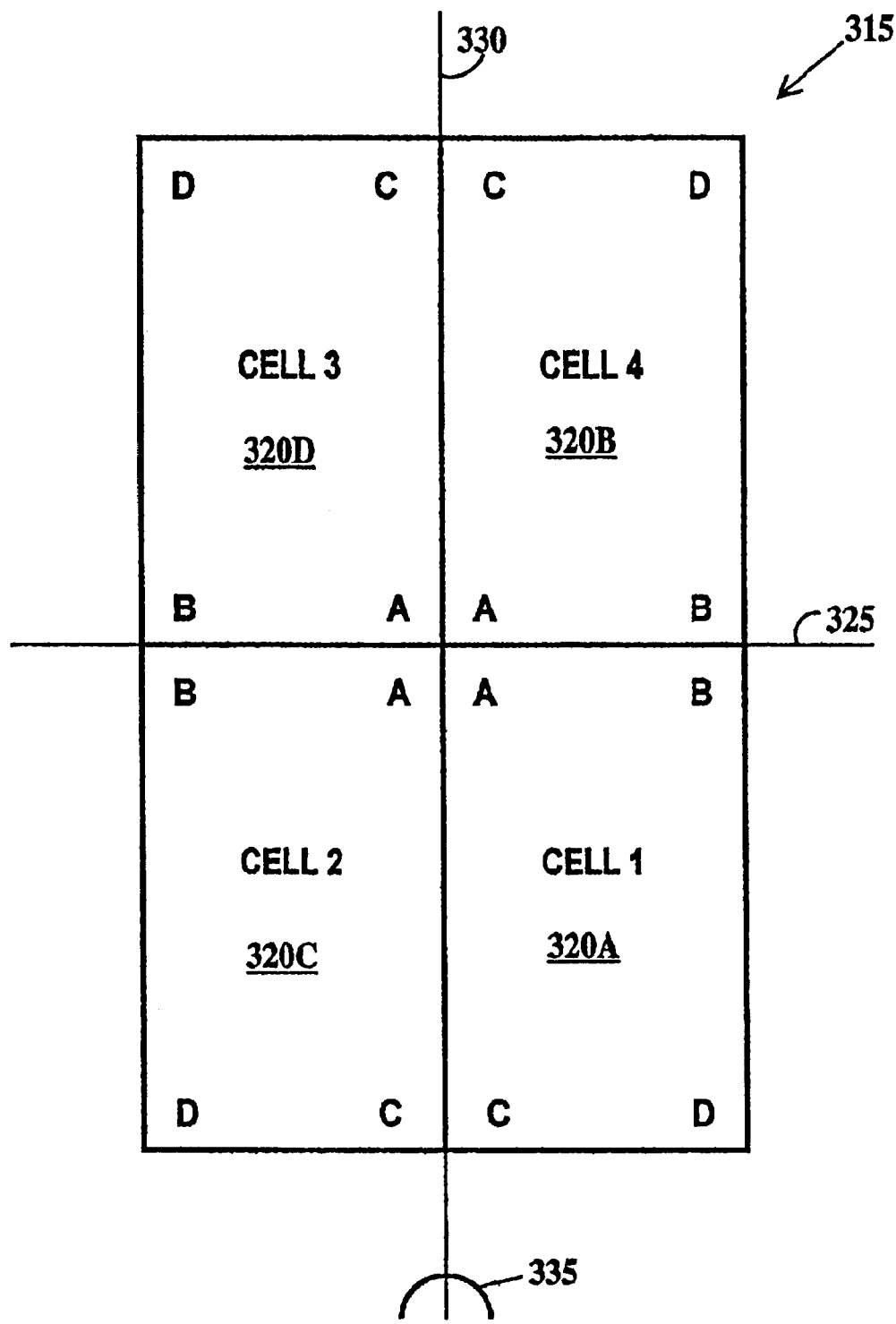
FIG. 8 is a diagram illustrating the relationship between four adjacent SRAM cells according to the present invention.

FIG. 8 is a diagram illustrating the relationship between four adjacent SRAM cells according to the present invention. SRAM cells are usually designed mirrored in two directions in order to increase density. In FIG. 8, a repeating SRAM pattern 315 includes SRAM cells 320A, 320B, 320C and 320D. SRAM cell 320A has corners A, B, C and D. SRAM cell 320B is a mirror image of SRAM cell 320A mirrored along a horizontal axis 325. SRAM cell 320D is a mirror image of SRAM cell 320C mirrored along horizontal axis 325. SRAM cell 320C is a mirror image of SRAM cell 320A mirrored along a vertical axis 330. SRAM cell 320D is a mirror image of SRAM cell 320B mirrored along vertical axis 330. A complete SRAM array includes a multiplicity of SRAM patterns 315 tiled in the vertical and/or horizontal direction. Thus, a description of the layout of SRAM cell 320A suffices to describe the layouts of SRAM cells 320B, 320C and 320D.

In the case of FIG. 8, vertical axis 330 runs through notch 335 of a substrate. In the general case, vertical axis 330 runs parallel to a vertical centerline running through notch 335. Vertical axis 330 is orientated 22.5° from the {100} and {110} crystal planes of the substrate.

Figure 9:
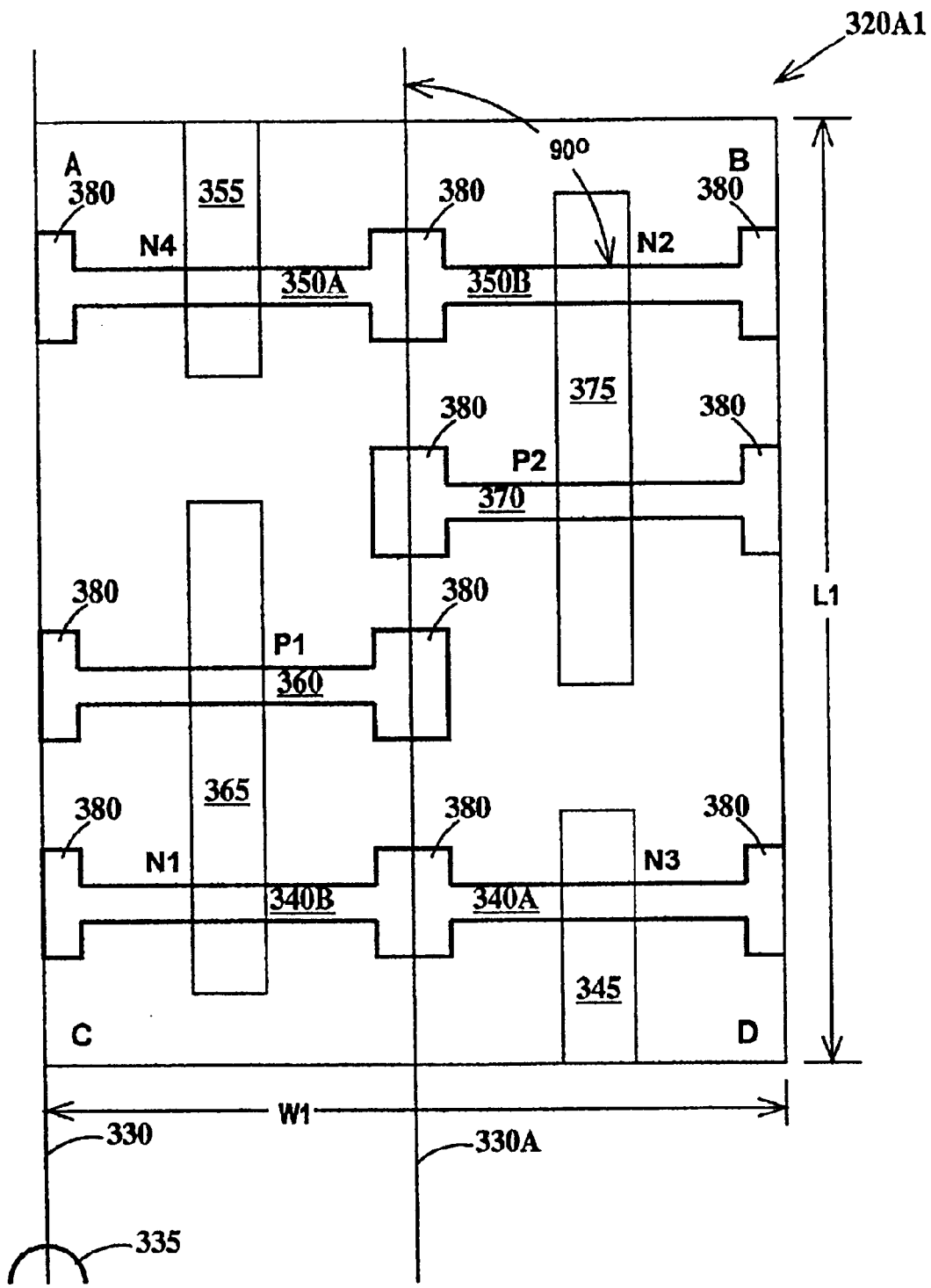
FIG. 9 is diagram illustrating the layout of an SRAM cell according to a first embodiment of the present invention.

FIG. 9 is diagram illustrating the layout of an SRAM coil 320A1 according to a first embodiment of the present invention. In FIG. 9 a vertical axis 330A is parallel to vertical axis 330 that passes through notch 335. Vertical axis 330A is orientated 22.5° clockwise from the {100} crystal plane and 22.5° counterclockwise from the {110} crystal plane. In FIG. 9, SRAM cell 320A1 includes a first pass gate NFET N3 comprising a fin 340A and a gate 345, a second pass gate NFET N4 comprising a fin 350A and a gate 355, a first pull up PFET comprising a fin 360 and a common gate 365, a first pull down NFET N1 comprising a fin 340B and common gate 365, a second pull up PFET P2 comprising a fin 370 arid a common gate 375, mid a second pull down NFET N2 comprising a fin 350B and common gate 375. Fins 340A and 340B are coextensive and fins 350A and 350B are coextensive.

Fins 340A, 340B, 350A, 350B, 360 and 370 are all orientated 90° from vertical axis 330A which is 22.5 degrees from the {100} or {110} crystal planes, thus providing medium majority carrier mobility (as defined supra) for pass gate NFETs N3 and N4, pull up PFETS P1 and P2, and pull down NFETS N1 and N2. The layout of SRAM 320A1 allows a high density SRAM (since length L1 and width W1 are driven only by design groundrules) having a relatively medium performance (since carrier mobility is medium in pull up PFETs P1 and P2, pull down NFETs N1 and N2, and pass gate NFETs N3 and N4) as compared to the second and third embodiments of the present invention. SRAM cell 320A1 may be used with standard CMOS logic technology or may be easily integrated with chevron CMOS logic technology as defined supra.

Fins structures include a multiplicity of contact pad regions 380 for landing of contacts onto the fins, however the contacts themselves as well as gate contacts and gate dielectric layers have been omitted for clarity, but are present as described supra. It should also be noted that NFETs N1, N2, N3 and N4 and PFETs P1 and P2 are double gated, that is, there is a gate on either sidewall of the fins.

Figure 10:
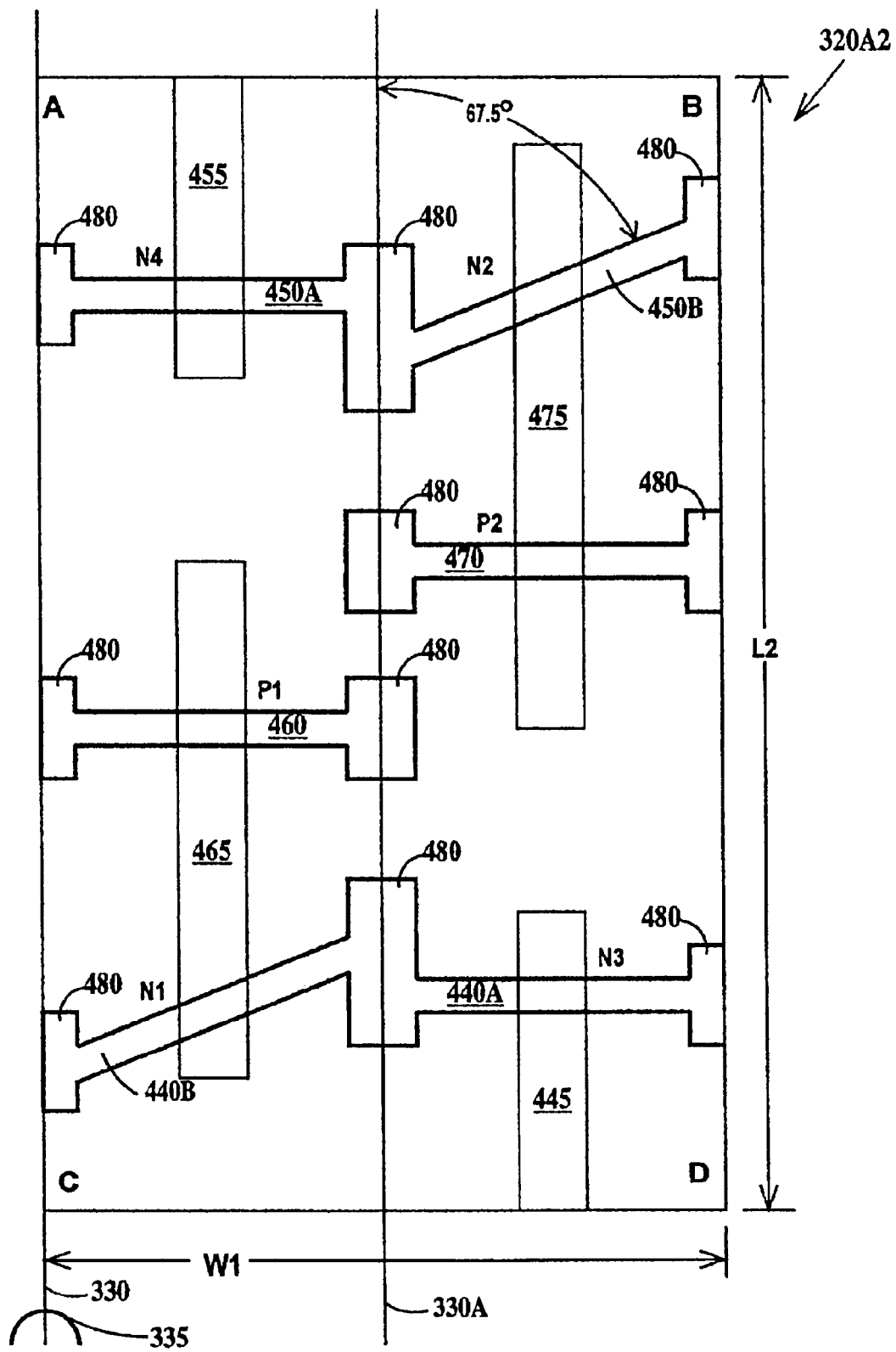
FIG. 10 is diagram illustrating the layout of an SRAM cell according to a second embodiment of the present invention

FIG. 10 is diagram illustrating the layout of am SRAM cell 320A2 according to a second embodiment of the present invention. In FIG. 10 a vertical axis 330A is parallel to vertical axis 330 that passes through notch 335. Vertical axis 330A is orientated 22.5° clockwise from the {100} crystal plane and 22.5° counterclockwise from the {110} crystal plane. In FIG. 10. SRAM cell 320A2 includes a first pass gate NFET N3 comprising a fin 440A and a gate 445, a second pass gate NEST N4 comprising a fin 450A and a gate 455, a first pull up PFET P1 comprising a fin 460 and a common gate 465, a first pull down NFET N1 comprising a fin 440B and common gate 465, a second pull up PFET P2 comprising a fin 470 and a common gate 475, and a second pull down NFET N2 comprising a fin 450B and common gate 475. Fins 440A and 440B are coextensive and tins 450A and 450B are coextensive.

Fins 440A, 450A, 460 and 470 arc orientated 90° from vertical axis 330A which is 22.5 degrees from the {100} or {110} crystal planes, thus providing medium majority carrier mobility (as defined supra) for pass gate NEST. N3 and N4 and pull up PFETS P1 and P2. Fins 440B and 450B are orientated 67.5° from vertical axis 330A, which is on the {100} crystal plane, thus providing high majority carrier mobility (as defined supra) for pull down NFETs N1 and N2. The layout of SRAM 320A2 allows a medium performance SRAM (since majority carrier mobility in pull down NFETs N1 and N2 is high but majority carrier mobility in pass gates NFETs N3 and N4 is medium) having a relatively medium density (since length L3 is driven by groundrules and the extra space required to lay out fins 440B and 450B along a diagonal) as compared to the first and second embodiments of the present invention. SRAM call 320A3 may be used with standard CMOS logic technology or may be easily integrated with chevron CMOS logic technology as defined supra.

Fins structures include a multiplicity of contact pad regions 480 for landing of contacts onto the fins, however the contacts themselves as well as gate contacts and gate dielectric layers have been omitted for clarity, but are present as described supra. It should also be noted that NFETs N1, N2, N3 and N4 and PFETs P1 and P2 are double gated.

Figure 11:
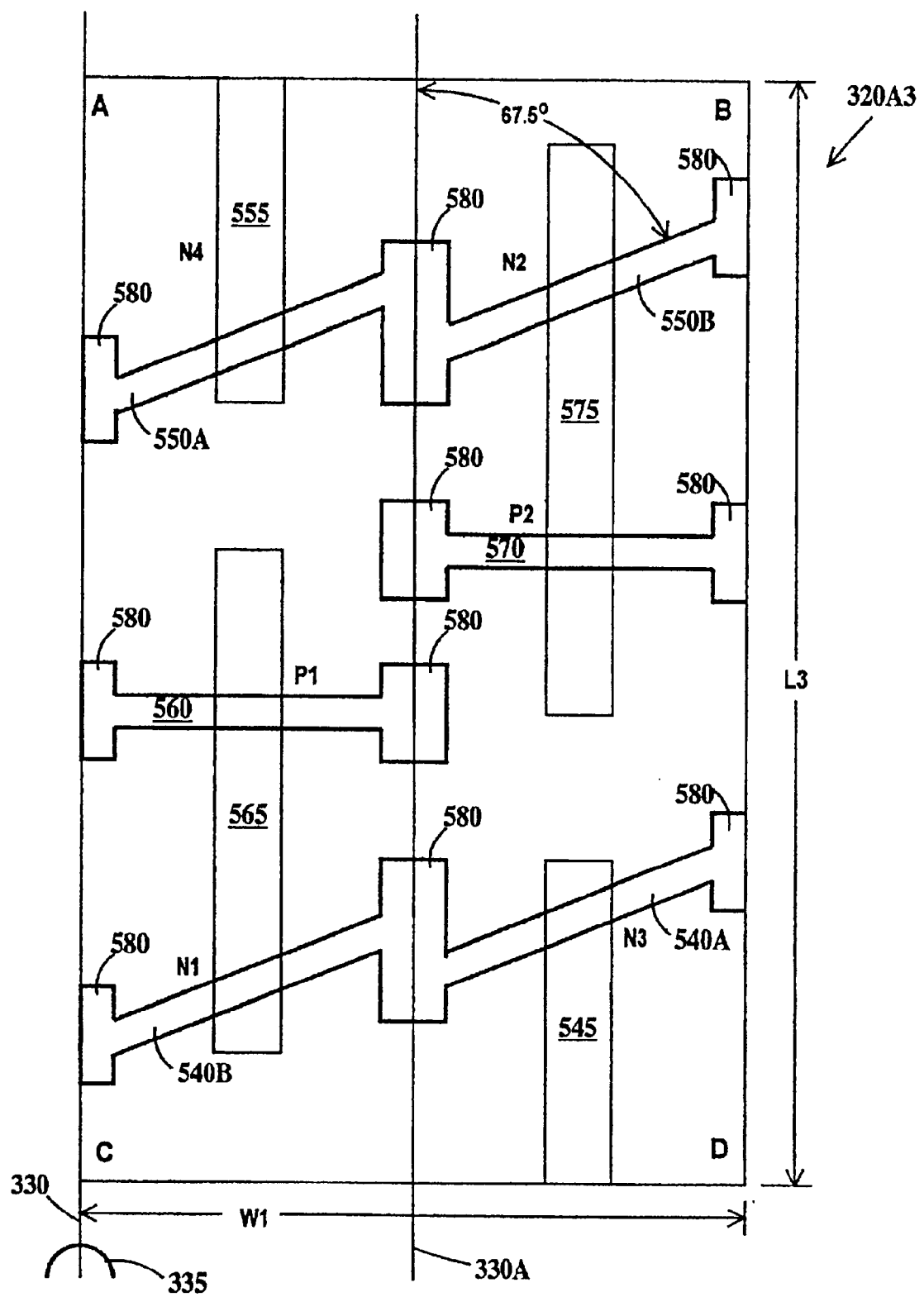
FIG. 11 is a diagram illustrating the layout of an SRAM cell according to a first alternative of a third embodiment of the present invention.

FIG. 11 is a diagram illustrating the layout of an SRAM cell 320A3 according to it first alternative of a third embodiment of the present invention. In FIG. 11 a vertical axis 330A is parallel to vertical axis 330 that passes through notch 335. Vertical axis 330A is orientated 22.5° clockwise from the {100} crystal plane and 22.5° counterclockwise from the {110} crystal plane. In FIG. 11, SRAM cell 320A3 includes a first pass gate NFET N3 comprising a fin 540A and a gate 545, a second pass gate NFET N4 comprising a fin 550A and a gate 555, a first pull up PFET P1 comprising a fin 560 and a common gate 565, a first pull down NFET N1 comprising a fin 540B and common gate 565, a second pull up PEST P2 comprising a fin 570 and a common gate 575, and a second pull down NFET N2 comprising a fin 550B and common gate 575. Fins 540A and 540B are coextensive and fins 550A and 550B are coextensive.

Fins 560 and 570 are orientated 90° from vertical axis 330A, which is 22.5 degrees from the {100} or {110} crystal planes, thus providing medium majority carrier mobility (as defined supra) for pull up PFETS P1 and P2. Fins 540A, 540B, 550A and 550B are orientated 67.5° from vertical axis 330A which is on the {100} crystal plane, thus providing high majority carrier mobility (as defined supra) for pass gate NFETs N3 and N4 and pull down NFETs N1 and N2. The layout of SRAM 320A3 allows a medium density SRAM (since length L2 is driven by groundrules and the extra space required to lay out fins 540A, 540B, 550A and 550B along a diagonal) having a high performance (due to pull down NFETs N1 and 2 and pass gate NFETS N3 and N4 having high majority carrier mobility) as compared to the first and second embodiments of the present invention. SRAM cell 320A3 may be used with standard CMOS logic technology or may be easily integrated with chevron CMOS logic technology as defined supra.

Fin structures include a multiplicity of contact pad regions 580 for landing of contacts onto the fins, however the contacts themselves as well as gate contacts and gate: dielectric layers have been omitted for clarity, but are present as described supra. It should also be noted that NFETs N1, N2, N3 and N4 and PFETs P1 and P2 are double gated.

Figure 12:
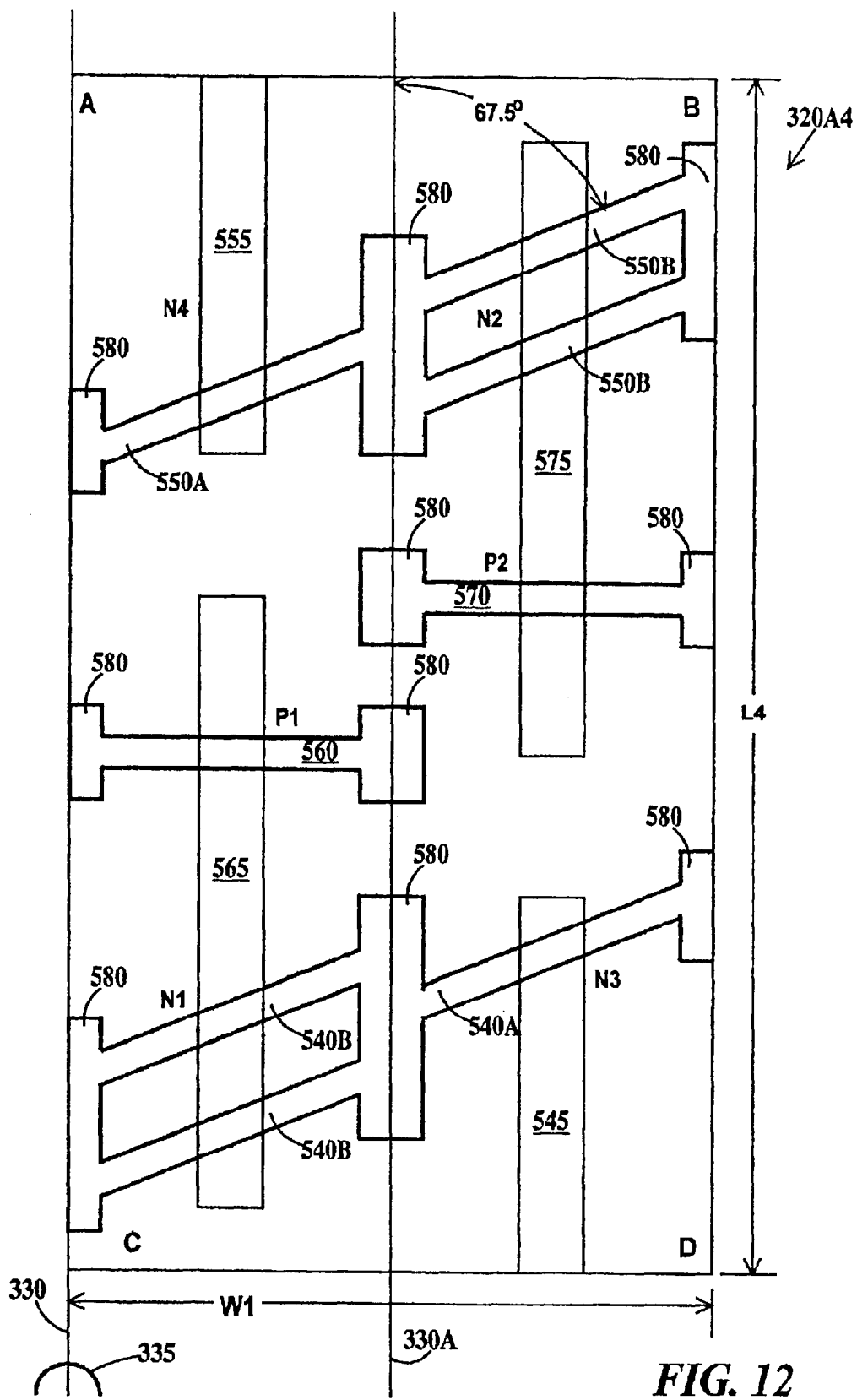
FIG. 12 is a diagram illustrating the layout of an SRAM cell according to a second alternative of a third embodiment of the present invention.

FIG. 12 is a diagram illustrating the layout of an SRAM cell 320A4 according to a second alternative of a third embodiment of the present invention. SRAM cell 320A4 is similar to SRAM cell 320A3 of FIG. 11 except for the fact pull down NFETs N3 and N4 are double finned and L4 is slightly greater than L3 (see FIG. 11).

SRAM cells may be fabricated on the same integrated circuit chip using standard CMOS logic or chevron CMOS logic or both standard and chevron CMOS logic in support or other functional circuits as discussed supra. Thus, several FinFET SRAM designs that fully utilize the advantages of FinFET technology have been disclosed.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. An electronic device comprising:
a semiconductor device comprising:
a pass gate transistor including a first fin body and a first gate, said first fin body having opposing sidewalls, each sidewall aligned in a first direction having a first majority carrier mobility, said first gate adjacent to both sidewalls or said first fin body;
a pull down latch transistor including a second fin body and a second gate, said second fin body having opposing sidewalls, each sidewall aligned in a second direction having a second majority carrier mobility, said second gate adjacent to both sidewalls of said second fin body;
a pull up latch transistor including a third fin body and a third gate, said third fin body having opposing sidewalls, each sidewall aligned in a third direction having a third majority carrier mobility, said third gate adjacent to both sidewalls of said third fin body;
wherein all of said first, second and third directions are not the same direction; and
one or more CMOS chevron logic circuits, crystal planes of bodies of transistors of said CMOS chevron logic circuits and crystal planes of said first, second and third fin bodies co-aligned.

2. The semiconductor device of claim 1, wherein said first and second directions are parallel to a {100} crystal plane of said fin bodies and said third direction is aligned between said {100} crystal plane and a {110} crystal plane of said fin bodies.

3. The semiconductor device of claim 2, wherein said third direction is halfway between said {100} crystal plane and said {110} crystal plane.

4. The semiconductor device of claim 1, wherein said first majority carrier mobility is a high majority carrier mobility, said second majority carrier mobility is a high majority carrier mobility and said third majority carrier mobility is a medium majority carrier mobility.

5. The semiconductor device of claim 1, wherein said second direction is parallel to a {100} crystal plane of said fin bodies and said first and third directions and aligned between said {100} crystal plane and a {110} crystal plane of said fin bodies.

6. The semiconductor device of claim 5, wherein said first and third directions are in a same direction which bisects an angle between said {100} crystal plane and said {110} crystal plane.

7. The semiconductor device of claim 1, wherein said first majority carrier mobility is a high majority carrier mobility, said second majority carrier mobility is a medium majority carrier mobility and said third majority carrier mobility is a medium majority carrier mobility.

8. The semiconductor device of claim 1, wherein said first, second and third directions each bisects an angle between said {100} and a {110} crystal planes of said first, second and third fin bodies respectively.

9. The semiconductor device of claim 8, wherein said first, second and third direction are equal and halfway between said {100} crystal plane and said {110} crystal plane.

10. The semiconductor device of claim 1, wherein said first majority carrier mobility is a medium majority carrier mobility, said second majority carrier mobility is a medium majority carrier mobility and said third majority carrier mobility is a medium majority carrier mobility.

11. The semiconductor device of claim 1, wherein said first fin body and said second fin body are contiguous.

12. The semiconductor device of claim 1, wherein said second and third gates are contiguous.

13. The semiconductor device of claim 1, wherein:
   said first fin body includes two fin portions, each fin portion having opposing sidewalls, said fin portions separated by a gap; and
   wherein said first gate is adjacent to both sidewalls of both fin portions.

14. The semiconductor device of claim 1, wherein said pass gate transistor and said pull down transistor latch are NFBTs and said pull-up latch transistor is a PFET.

15. A method of fabricating a semiconductor device comprising:
   forming a first fin body of a pass gate transistor from a crystal layer, said first fin body having opposing sidewalls, each sidewall aligned in a first direction having a first majority carrier mobility;
   forming a second fin body of a pull down latch transistor from said crystal layer, said second fin body having opposing sidewalls, each sidewall aligned in a second direction having a second majority carrier mobility;
   forming a third fin body of a pull up latch transistor from said crystal layer said third fin body having opposing sidewalls, each sidewall aligned in a first direction having a third majority carrier mobility; and
   forming a first gate adjacent to bath sidewalls of said first fin body, a second gate adjacent to both sidewalls of said second fin body and a third gate adjacent to both sidewalls of said third fin body
   wherein all of said first, second and third directions are not the same direction; and
   forming bodies of CMOS devices of one or more CMOS chevron logic circuits from said crystal layer.

16. The method of claim 15, wherein said first and second directions are parallel to a {100} crystal plane of said fin bodies and said third direction is aligned between said {100} crystal plane and a {110} crystal plane of said fin bodies.

17. The method of claim 16, wherein said third direction is halfway between said {100} crystal plane and said {110} crystal plane.

18. The method device of claim 15, wherein said first majority carrier mobility is a high majority carrier mobility, said second majority carrier mobility is a high majority carrier mobility and said third majority carrier mobility is a medium majority carrier mobility.

19. The method of claim 15, wherein said second direction is parallel to a {100} crystal plane of said fin bodies and said first and third directions and aligned between said {100} crystal plane and a {110} crystal plane of said fin bodies.

20. The method of claim 19, wherein said first and third directions are in a same direction which bisects an angle between said {100} crystal plane and said {110} crystal plane.

21. The method of claim 15, wherein said first majority carrier mobility is a high majority carrier mobility, said second majority carrier mobility is a medium majority carrier mobility and said third majority carrier mobility is a medium majority carrier mobility.

22. The method of claim 15, wherein said first, second and third directions are aligned between said {100} and a {110} crystal planes of said fin bodies.

23. The method of claim 22, wherein said first, second and third directions each bisects an angle between said {100} and a {110} crystal planes of said first, second and third fin bodies respectively.

24. The method of claim 15, wherein said first majority carrier mobility is a medium majority carrier mobility, said second majority carrier mobility is a medium majority carrier mobility and said third majority carrier mobility is a medium majority carrier mobility.

25. The method of claim 15, wherein said first fin body and said second fin body are contiguous.

26. The method of claim 15, wherein said second and third gates are contiguous.

27. The method of claim 15, wherein:
   said first fin body includes two fin portions, each fin portion having opposing sidewalls, said fin portions separated by a gap; and
   wherein said first gate is adjacent to both sidewalls of both fin portions.

28. The method of claim 15, wherein said pass gate transistor and said pull down latch transistor are NFETs and said pull-up latch transistor is a PFET.

29. An electronic device comprising:
   an SRAM cell comprising:
      first and second pass gate transistors, each pass gate transistor, including a fin body and a gate, said first fin bodies each having opposing sidewalls and each sidewall aligned in a first direction having a first majority carrier mobility, said gate adjacent to both sidewalls;
      first and second pull down latch transistors, each pull down transistor including a fin body and a gate, each fin body having opposing sidewalls and each sidewall aligned in a second direction having a second majority carrier mobility, said gate adjacent to both sidewalls;
      first and second pull down latch transistors, each pull down transistor including a fin body and a gate, each fin body having opposing sidewalls and each sidewall aligned in a third direction having a third majority carrier mobility, said gate adjacent to both sidewalls, said third direction aligned between {100} crystal plane and a {110} crystal plane of said fin bodies of said first and second pull up latch transistors; and
      wherein all of said first, second and third directions are not the same direction; and
   one or more CMOS chevron logic circuits, crystal planes of bodies of transistors of said CMOS chevron logic circuits co-aligned with crystal planes of said fin bodies of said pass gate transistors, said pull down latch transistors and said pull up latch transistors.

30. The SRAM cell of claim 29, wherein said first and second directions are aligned with said {100} crystal plane, said first direction is aligned with said {100} crystal plane and said second direction bisects an angle between said {100} and {110} crystal planes, or both said first and second directions each bisect the angle between said {100} and {110} crystal planes.

* * * * *